(12) United States Patent
Andersson et al.

(10) Patent No.: US 7,799,413 B2
(45) Date of Patent: *Sep. 21, 2010

(54) COATED CUTTING TOOL INSERT

(75) Inventors: Gunilla Andersson, Sollentuna (SE);
Anders Karlsson, Stockholm (SE);
Katarina Dahl, Sandviken (SE); Jan Kjellgren, Kista (SE); Peter Littecke, Huddinge (SE)

(73) Assignee: Sandvik Intellectual Property AB, Sandviken (SE)

( * ) Notice: Subject to any disclaimer, the term of this patent is extended or adjusted under 35 U.S.C. 154(b) by 389 days.

This patent is subject to a terminal disclaimer.

(21) Appl. No.: 11/808,399

(22) Filed: Jun. 8, 2007

(65) Prior Publication Data

US 2007/0298281 A1      Dec. 27, 2007

Related U.S. Application Data

(63) Continuation-in-part of application No. PCT/SE2006/000736, filed on Jun. 16, 2006.

(30) Foreign Application Priority Data

Jun. 17, 2005  (SE) ..................... 0501410
Dec. 15, 2006  (SE) ..................... 0602723

(51) Int. Cl.
    *B32B 9/00*      (2006.01)
(52) U.S. Cl. .............. 428/216; 51/307; 51/309; 407/119; 428/336; 428/698; 428/699; 428/701; 428/702

(58) Field of Classification Search ............ 51/307, 51/309; 428/216, 336, 698, 699, 701, 702; 407/119
See application file for complete search history.

(56) References Cited

U.S. PATENT DOCUMENTS

| 4,966,501 | A | * | 10/1990 | Nomura et al. ........... 407/119 |
| 5,654,035 | A | * | 8/1997 | Ljungberg et al. ..... 427/255.34 |
| 5,702,808 | A |   | 12/1997 | Ljungberg |
| 5,851,687 | A |   | 12/1998 | Ljungberg |
| 5,861,210 | A |   | 1/1999 | Lenander et al. |
| 5,863,640 | A | * | 1/1999 | Ljungberg et al. ......... 428/216 |
| 5,945,207 | A |   | 8/1999 | Kutscher et al. |
| 6,015,614 | A |   | 1/2000 | Ruppi |

(Continued)

FOREIGN PATENT DOCUMENTS

EP         0 298 729         1/1989

(Continued)

OTHER PUBLICATIONS

I. Noyan et al., "Residual Stress: Measurement by Diffraction and Interpretation," New York: Springer-Verlag, pp. 117-129 (1987).

*Primary Examiner*—Archene Turner
(74) *Attorney, Agent, or Firm*—Drinker Biddle & Reath LLP

(57) ABSTRACT

A CVD-coated cutting tool insert with improved toughness properties having the ability to withstand high temperatures without sacrificing edge line security is disclosed. The insert coating comprises a $TiC_xN_y$-layer with a low tensile stress level of 50-500 MPa and an $\alpha$-$Al_2O_3$-layer with a high surface smoothness with a mean Ra<0.12 μm as measured by AFM-technique, obtained by subjecting the coating to an intensive wet blasting operation.

27 Claims, 1 Drawing Sheet

U.S. PATENT DOCUMENTS

| | | | |
|---|---|---|---|
| 6,333,098 B1 * | 12/2001 | Olsson et al. | 51/309 |
| 6,869,334 B1 | 3/2005 | Leyendecker et al. | |
| 6,884,496 B2 | 4/2005 | Westphal et al. | |
| 7,090,914 B2 * | 8/2006 | Yamagata et al. | 428/701 |
| 7,163,735 B2 * | 1/2007 | Ruppi | 428/698 |
| 7,306,636 B2 * | 12/2007 | Ljungberg | 51/307 |
| 7,416,778 B2 * | 8/2008 | Westergren et al. | 428/336 |
| 2006/0204757 A1 * | 9/2006 | Ljungberg | 428/702 |
| 2007/0009763 A1 | 1/2007 | Littecke et al. | |

FOREIGN PATENT DOCUMENTS

| | | |
|---|---|---|
| EP | 0 603 144 A1 | 6/1994 |
| EP | 0 736 615 | 10/1996 |
| EP | 0 753 603 A2 | 1/1997 |
| EP | 0 693 574 | 4/1998 |
| EP | 1 306 150 | 5/2003 |
| EP | 1 464 727 | 10/2004 |
| EP | 1 734 155 | 12/2006 |
| WO | WO 99/23275 | 5/1999 |
| WO | WO 02/077312 | 10/2002 |
| WO | WO 2006/135325 | 12/2006 |
| WO | WO 2006/135330 | 12/2006 |

\* cited by examiner

COATED CUTTING TOOL INSERT

CROSS REFERENCE TO RELATED APPLICATIONS

This application is a Continuation-in-Part patent application under 37 C.F.R. §1.53(b), of pending prior International Application No. PCT/SE2006/000736, having a filing date of Jun. 16, 2006, which claims priority to Swedish Patent Application No. 0501410-5 filed Jun. 17, 2005, of pending prior U.S. application Ser. No. 11/454,127, having a filing date of Jun. 16, 2006, which also claims priority to Swedish Patent Application No. 0501410-5 filed Jun. 17, 2005, and this application also claims priority to Swedish Patent Application No. 0602723-9 filed Dec. 15, 2006; the content of each of these applications is incorporated by reference herein.

FIELD

The present disclosure relates to a high performance coated cutting tool insert particularly useful for turning in low alloyed steel, carbon steel and tough hardened steels in the area from finishing to roughing in wet and dry conditions at high cutting speed, having the ability to withstand high temperatures without sacrificing edge security. The insert is based on WC, cubic carbides and a Co-binder phase with a cobalt enriched surface zone giving the cutting insert an excellent resistance to plastic deformation and a high toughness performance. Furthermore, the coating comprises a number of wear resistance layers which have been subjected to a surface post treatment giving the tool insert a surprisingly improved cutting performance.

BACKGROUND

In the discussion of the background that follows, reference is made to certain structures and/or methods. However, the following references should not be construed as an admission that these structures and/or methods constitute prior art. Applicant expressly reserves the right to demonstrate that such structures and/or methods do not qualify as prior art.

The majority of today's cutting tools are based on a cemented carbide insert coated with several hard layers like TiC, $TiC_xN_y$, TiN, $TiC_xN_yO_z$ and $Al_2O_3$. The sequence and the thickness of the individual layers are carefully chosen to suit different cutting application areas and work-piece materials. The most frequent employed coating techniques are Chemical Vapor Deposition (CVD) and Physical Vapor Deposition (PVD). CVD-coated inserts in particular have a tremendous advantage in terms of flank and crater wear resistance over uncoated inserts.

The CVD technique is conducted at a rather high temperature range, 950-1050° C. Due to this high deposition temperature and to a mismatch in the coefficients of thermal expansion between the deposited coating materials and the cemented carbide tool insert, CVD can lead to coatings with cooling cracks and high tensile stresses (sometimes up to 1000 MPa). The high tensile stresses can under some cutting conditions be a disadvantage as it may cause the cooling cracks to propagate further into the cemented carbide body and cause breakage of the cutting edge.

In the metal cutting industry there is a constant striving to increase the cutting condition envelope, i.e., the ability to withstand higher cutting speeds without sacrificing the ability to resist fracture or chipping during interrupted cutting at low speeds.

Important improvements in the application envelope have been achieved by combining inserts with a binder phase enriched surface zone and optimized, thicker coatings.

However, with an increasing coating thickness, the positive effect on wear resistance is out-balanced by an increasing negative effect in the form of an increased risk of coating delamination and reduced toughness making the cutting tool less reliable. This applies in particular to softer work piece materials such as low carbon steels and stainless steels and when the coating thickness exceeds 5-10 μm. Further, thick coatings generally have a more uneven surface, a negative feature when cutting smearing materials like low carbon steels and stainless steel. A remedy can be to apply a post smoothing operation of the coating by brushing or by wet blasting as disclosed in several patents, e.g., EP 0 298 729, EP 1 306 150 and EP 0 736 615. In U.S. Pat. No. 5,861,210 the purpose has, e.g., been to achieve a smooth cutting edge and to expose the $Al_2O_3$ as the outermost layer on the rake face leaving the TiN on the clearance side to be used as a wear detection layer. A coating with high resistance to flaking is obtained.

Every post treatment technique that exposes a surface, e.g., a coating surface to a mechanical impact as, e.g., wet or dry blasting will have some influence on the surface finish and the stress state (σ) of the coating.

An intense blasting impact may lower the tensile stresses in a CVD-coating, but often this will be at the expense of lost coating surface finish by the creation of ditches along the cooling cracks or it can even lead to delamination of the coating.

A very intensive treatment may even lead to a big change in the stress state, e.g., from highly tensile to highly compressive as disclosed in EP-A-1 311 712, in which a dry blasting technique is used.

SUMMARY

It has now surprisingly been found that a cutting tool insert having a combination of a certain cemented carbide substrate composition and a certain coating structure and thickness, and being post treated by wet-blasting under controlled conditions obtains excellent cutting properties over a broader range of applications than prior art cutting tool inserts.

The cobalt binder phase is highly alloyed with W. The content of W in the binder phase can be expressed as the CW-ratio:

$$CW\text{-ratio}=M_s/(\text{wt-\%Co}*0.0161)$$

wherein $M_s$=measured saturation magnetization in $hAm^2/kg$ and wt-% Co is the cobalt content in the cemented carbide. A low CW-ratio corresponds to a high W-content in the Co binder phase. The employed post treatment will give the coating a favorable tensile stress level, the $Al_2O_3$-layer a certain important crystallographic feature and a top surface with an excellent surface finish.

The mentioned combination with the blasting technique effectively expands the limitations of what coating thickness that can be applied without performance penalty. As a result of the invention application areas of unsurpassed width is now possible. The significant improvements achieved with respect to toughness behavior and coating adhesion was surprising.

To significantly change the stress state of a coating by blasting, the blasting media, e.g., $Al_2O_3$ grits have to strike the coating surface with a high impulse. The impact force can be controlled by, e.g., the blasting pulp pressure (wet blasting), the distance between blasting nozzle and coating surface, grain size of the blasting media, the concentration of the blasting media and the impact angle of the blasting jet.

It is an object of the present invention to provide CVD-coated tool inserts with improved toughness properties having the ability to withstand high temperatures without sacrificing edge security or toughness.

An exemplary embodiment of a coated cutting tool insert of cemented carbide comprises a body of generally polygonal or round shape having at least one rake face and at least one clearance face, and a coating on the body, wherein said insert is at least partly coated with the coating, wherein said body has a composition including 4.4-6.6 wt-% Co, 4-8.5 wt-% cubic carbides, balance WC, a CW-ratio in the range 0.78-0.92 and has a surface zone of a thickness of 10 to 40 µm, depleted from the cubic carbides TiC, TaC and/or NbC, wherein said coating is 10-25 µm thick and includes at least one layer of $TiC_xN_y$, where $x \geq 0$, $y \geq 0$ and $x+y=1$ and an $\alpha$-$Al_2O_3$-layer, the $\alpha$-$Al_2O_3$-layer being the outer layer at least on the rake face, and wherein:

(i) on said at least one rake face: the $TiC_xN_y$-layer has a thickness of from 3 µm to 15 µm and a tensile stress level of 50-500 MPa, and the $\alpha$-$Al_2O_3$-layer has a thickness of from 3 µm to 12 µm, is the outermost layer with an XRD-diffraction intensity ratio $I(012)/I(024) \geq 1.3$, and has a mean Ra value MRa<0.12 µm at least in the chip contact zone on the rake face, and on said at least one clearance face: the $TiC_xN_y$-layer has a tensile stress in the range 500-700 MPa, and the $\alpha$-$Al_2O_3$-layer has an XRD-diffraction intensity ratio $I(012)/I(024) < 1.5$, or (ii) on said at least one rake face and said at least one clearance face: the $TiC_xN_y$-layer has a thickness of from 3 µm to 15 µm and a tensile stress level of 50-500 MPa, the $\alpha$-$Al_2O_3$-layer has a thickness of from 3 µm to 12 µm, has an XRD-diffraction intensity ratio $I(012)/I(024) \geq 1.3$, and is the outermost layer on the rake face with a mean Ra value MRa<0.12 µm at least in the chip contact zone on the rake face, and the outermost layer on said clearance face consists of a colored heat resistant paint or a colored PVD-layer.

It is to be understood that both the foregoing general description and the following detailed description are exemplary and explanatory and are intended to provide further explanation of the invention as claimed.

BRIEF DESCRIPTION OF THE DRAWING

The following detailed description can be read in connection with the accompanying drawings in which like numerals designate like elements and in which:

FIG. 1 shows a goniometer set-up for the evaluation of residual stress by X-ray measurements in which:

Figure 1:
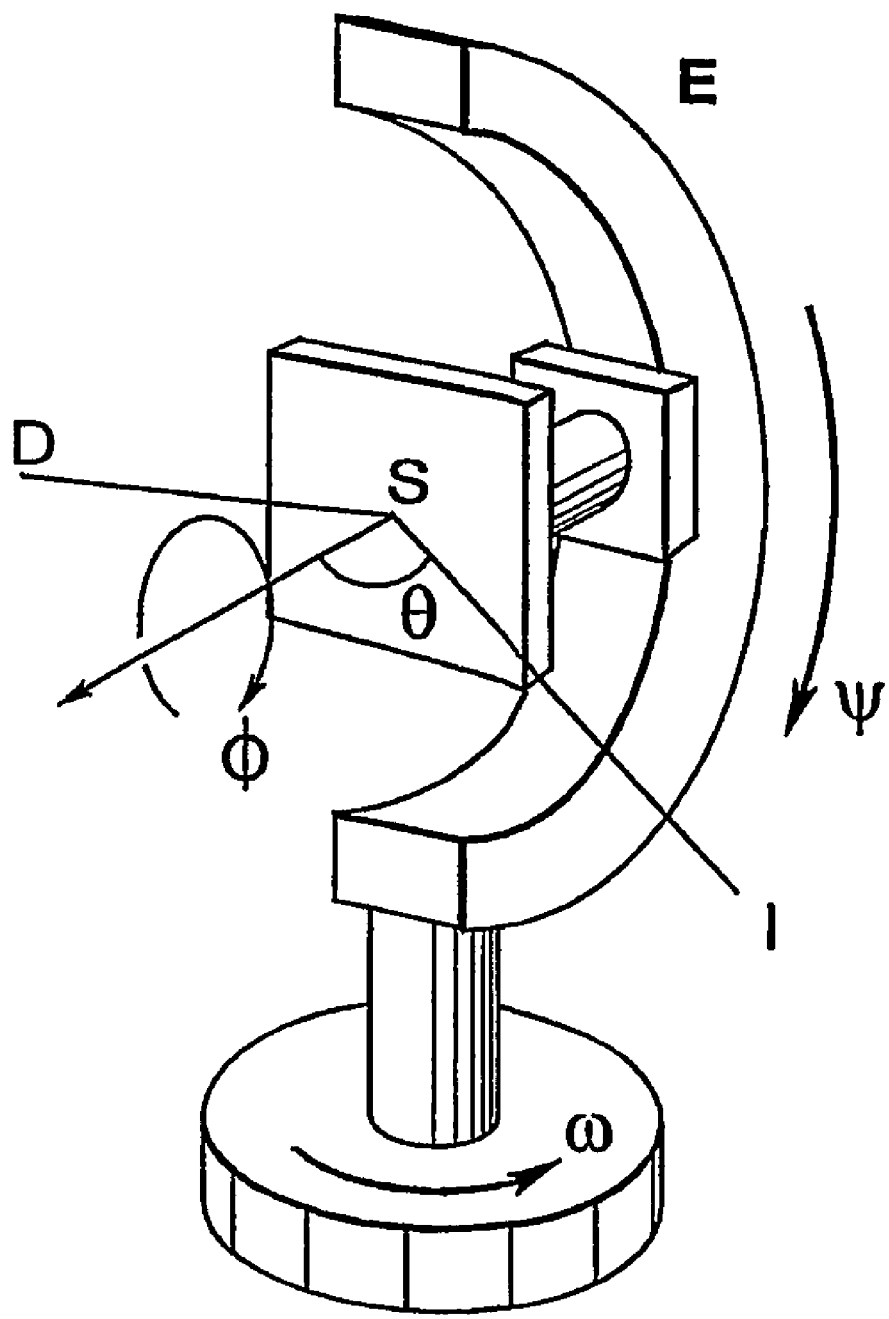

E=Euler ¼-cradle
S=sample
I=incident X-ray beam
D=diffracted X-ray beam
θ=diffraction angle
ω=θ
ψ=tilt angle along the Euler ¼-cradle
φ=rotation angle around the sample axis.

DETAILED DESCRIPTION

The present disclosure thus relates generally to coated cutting tool inserts. In exemplary embodiments, the coated cutting tool inserts comprise a body of generally polygonal or round shape having at least one rake face and at least one clearance face, comprising a coating and a carbide substrate. The body has a composition of 4.4-6.6, preferably 5.0-6.0, most preferably 5.0-5.8, wt-% Co, 4-8.5 wt-% cubic carbides, balance WC, preferably 85-91 wt-% WC, most preferably 87-90 wt-% WC, preferably having an average grain size of 1-4 µm, a CW-ratio in the range 0.78-0.92 and a surface zone depleted from the cubic carbides TiC, TaC and/or NbC.

Said surface zone depleted from cubic carbides has a thickness of from 10 µm, alternatively from 15 µm, or alternatively from 20 µm, to 40 µm, alternatively to 35 µm, alternatively to 30 µm, or alternatively to 25 µm.

The coating comprises at least one $TiC_xN_y$-layer and one well-crystalline layer of 100% $\alpha$-$Al_2O_3$. One such $\alpha$-$Al_2O_3$-layer is the outermost visible layer on the rake face and along the cutting edge line and the layer can be intensively wet blasted with a sufficiently high energy to create tensile stress relaxation in both the $Al_2O_3$- and the $TiC_xN_y$-layers. The $Al_2O_3$ outermost layer has a very smooth surface at least in the chip contact zone on the rake face.

It has surprisingly been discovered that a significant improved toughness performance can be achieved if a coated cutting tool insert with a generally polygonal or round shape having at least one rake face and at least one clearance face, said insert being at least partly coated, produced to possess the following features:

a penultimate $TiC_xN_y$-layer with a thickness of from 3 µm, preferably from 4 µm, more preferably from 5 µm, most preferably from 6 µm to 15 µm, preferably to 13 µm, most preferably to 10 µm, where $x \geq 0$, $y \geq 0$ and $x+y=1$, preferably produced by MTCVD, with tensile stresses of 50-500 MPa, preferably 50-450 MPa, most preferably 50-400 MPa, and an outer $\alpha$-$Al_2O_3$-layer with a thickness of from 3 µm, preferably from 3.5, most preferably from 4 µm to 12 µm, preferably to 11 µm, most preferably to 10 µm, being the outermost layer on the rake face and along the edge line having a mean roughness Ra<0.12 µm, preferably $\leq 0.10$ µm, at least in the chip contact zone of the rake face, measured over an area of 10 µm×10 µm by Atomic Force Microscopy (AFM) and an XRD-diffraction intensity (peak height minus background) ratio of $I(012)/I(024) \geq 1.3$, preferably $\geq 1.5$.

Preferably there is a thin 0.2-2 µm bonding layer of $TiC_xN_yO_z$, $x \geq 0$, $z > 0$ and $y \geq 0$ between the $TiC_xN_y$-layer and the $\alpha$-$Al_2O_3$-layer. The total thickness of the two layers is $\leq 25$ µm.

Also according to exemplary embodiments of the present disclosure, additional layers can be incorporated into the coating structure between the substrate and the layers, composed of metal nitrides and/or carbides and/or oxides with the metal elements selected from Ti, Nb, Hf, V, Ta, Mo, Zr, Cr, W and Al to a total coating thickness of <5 µm.

It is preferred to have some tensile stresses left in the $TiC_xN_y$-layer since it was found that such induced compressive stresses were not as stable with respect to temperature increase, which occurs in a cutting operation, as compared to if the coating has some tensile stresses still present. It was also found, that if compressive stresses were to be induced by blasting, a very high blasting impact force was required and under such conditions flaking of the coating frequently occurred along the cutting edge.

The residual stress, σ, of the inner $TiC_xN_y$-layer is determined by XRD measurements using the well known $sin^2\psi$ method as described by I. C. Noyan, J. B. Cohen, Residual Stress Measurement by Diffraction and Interpretation, Springer-Verlag, New York, 1987 (pp 117-130). The measurements are performed using $CuK_\alpha$-radiation on the $TiC_xN_y$ (422) reflection with a goniometer setup as shown in FIG. 1. The measurements are carried out on an as flat surface as possible. It is recommended to use the side-inclination technique (ψ-geometry) with six to eleven ψ-angles, equidistant within a $\sin^2\psi$-range of 0 to 0.5 (ψ=45°). An equidistant distribution of φ-angles within a φ-sector of 90° is also preferred. To confirm a biaxial stress state the sample shall be rotated for φ=0° and 90° while tilted in ψ. It is recommended to investigate possible presence of shear stresses and therefore both negative and positive ψ-angles shall be measured. In the case of an Euler ¼-cradle this is accomplished by measuring the sample also at φ=180° and 270° for the different ψ-angles. The $\sin^2\psi$ method is used to evaluate the residual stress preferably using some commercially available software such as DIFFRAC$^{Plus}$ Stress32 v. 1.04 from Bruker AXS with the constants Young's modulus, E=480 GPa and Poisson's ratio, ν=0.20 in case of a MTCVD Ti(C,N)-layer and locating the reflection using the Pseudo-Voigt-Fit function. In the case of the following parameters are used: E-modulus=480 GPa and Poisson's ratio ν=0.20. In case of a biaxial stress state the tensile stress is calculated as the average of the obtained biaxial stresses.

For the α-Al$_2$O$_3$ it is in general not possible to use the $\sin^2\psi$ technique since the required high 2θ angle XRD-reflections are often too weak. However, a useful alternative measure has been found which relates the state of the α-Al$_2$O$_3$ to cutting performance.

For an α-Al$_2$O$_3$ powder the diffraction intensity ratio I(012)/I(024) is close to 1.5. Powder Diffraction File JCPDS No 43-1484 states the intensities $I_0$(012)=72 and $I_0$(024)=48. For tensile stressed (with σ about >350 MPa) CVD α-Al$_2$O$_3$-layers on cemented carbide, the intensity ratio I(012)/I(024) is surprisingly significantly less than the expected value 1.5, most often <1. This may be due to some disorder in the crystal lattice caused by the tensile stresses. It has been found that when such a layer is stress released by, e.g., an intense blasting operation or if it has been completely removed from the substrate and powdered, the ratio I(012)/I(024) becomes closer, equal or even higher than 1.5. The higher the applied blasting force the higher the ratio will be. Thus, this intensity ratio can be used as an important state feature of an α-Al$_2$O$_3$-layer.

According to exemplary embodiments of the present disclosure, a cutting tool insert is provided with a CVD-coating comprising a penultimate TiC$_x$N$_y$-layer and an outer α-Al$_2$O$_3$-layer. The Al$_2$O$_3$ can be produced according to patent EP 603 144 giving the Al$_2$O$_3$-layer a crystallographic texture in 012-direction with a texture coefficient TC(012)>1.3, preferably >1.5 or produced according to U.S. Pat. No. 5,851,687 and U.S. Pat. No. 5,702,808 giving a texture in the 110-direction with texture coefficient TC(110) >1.5. In order to obtain a high surface smoothness and low tensile stress level the coating is subjected to a wet blasting operation with a slurry consisting of F150 grits (FEPA-standard) of Al$_2$O$_3$ in water at an air pressure of 2.2-2.6 bar for about 10-20 sec/insert. The spray guns are placed approximately 100 mm from the inserts with a 90° spray angle. The insert has a different color on the clearance side than on the black rake face. An outermost thin 0.1-2 μm coloring layer of TiN (yellow), TiC$_x$N$_y$ (grey or bronze), ZrC$_x$N$_y$ (reddish or bronze), where x≧0, y≧0 and x+y=1 or TiC (grey) is preferably deposited. The inserts are then blasted removing the top layer exposing the black Al$_2$O$_3$-layer. The coating on the rake face will have the low desired tensile stress 50-500 MPa while the clearance side will have high tensile stresses in the range 500-700 MPa, the tensile stress on the rake face being lower than the tensile stress on the clearance face, dependent on the choice of coating and the coefficient of Thermal Expansion (CTE) of the used cemented carbide insert. In another exemplary embodiment, the coated insert is blasted both on the rake face and the clearance side and a colored, heat resistant paint is sprayed on the clearance side or a colored PVD layer is deposited there in order to obtain a possibility to identify a used cutting edge.

EXAMPLE 1

The following samples were made:
A) Cemented carbide cutting inserts with the composition 5.5 wt-% Co, 2.9 wt-% TaC, 0.5 wt-% NbC, 1.4 wt-% TiC, 0.9 wt-% TiN, balance WC, having an average grain size of about 2 μm, with a surface zone, 29 μm thick, depleted from cubic carbides.
B) Cemented carbide cutting inserts with the composition 5.5 wt-% Co, 2.9 wt-% TaC, 0.5 wt-% NbC, 1.9 wt-% TiC, 0.4 wt-% TiN, balance WC, having an average grain size of about 2 μm, with a surface zone, 18 μm thick, depleted from cubic carbides.
C) Cemented carbide cutting inserts with the composition 5.5 wt-% Co, 2.9 wt-% TaC, 0.5 wt-% NbC, 1.6 wt-% TiC, 0.7 wt-% TiN, balance WC, having an average grain size of about 2 μm, with a surface zone, 23 μm thick, depleted from cubic carbides.

The saturation magnetization, $M_s$, for A)-C) was measured to be 0.077 hAm$^2$/kg giving a CW-ratio of 0.87. The inserts from A)-C) were coated with a 0.5 μm thick layer of TiN using conventional CVD-technique at 930° C. followed by a 7 μm TiC$_x$N$_y$-layer employing the MTCVD-technique using TiCl$_4$, H$_2$, N$_2$ and CH$_3$CN as process gases at a temperature of 885° C. In subsequent process steps during the same coating cycle a layer of TiC$_x$O$_z$ about 0.5 μm thick was deposited at 1000° C. using TiCl$_4$, CO and H$_2$, and then the Al$_2$O$_3$-process was stared up by flushing the reactor with a mixture of 2% CO$_2$, 3.2% HCl and 94.8% H$_2$ for 2 min before a 7 μm thick layer of α-Al$_2$O$_3$ was deposited. On top was a thin approx. 0.5 μm TiN layer deposited.

The process conditions during the deposition steps were as below:

|  | TiN | TiC$_x$N$_y$ | TiC$_x$O$_z$ | Al$_2$O$_3$-start | Al$_2$O$_3$ |
|---|---|---|---|---|---|
| Step | 1 and 6 | 2 | 3 | 4 | 5 |
| TiCl$_4$ | 1.5% | 1.4% | 2% | | |
| N$_2$ | 38% | 38% | | | |
| CO$_2$ | | | | 2% | 4% |
| CO | | | 6% | | |
| AlCl$_3$ | | | | | 3.2% |
| H$_2$S | | | | | 0.3% |
| HCl | | | | 3.2% | 3.2% |
| H$_2$ | balance | balance | balance | balance | balance |
| CH$_3$CN | — | 0.6% | | | |
| Pressure | 160 mbar | 60 mbar | 60 mbar | 60 mbar | 70 mbar |
| Temp. | 930° C. | 885° C. | 1000° C. | 1000° C. | 1000° C. |
| Time | 30 min | 4.5 h | 20 min | 2 min | 7 h |

Additional inserts were:
D) Cemented carbide cutting inserts of the same type as in A) differing only in TiC$_x$N$_y$- and α-Al$_2$O$_3$-layer thickness, being 6 μm and 10 μm thick respectively, were manufactured using the same processing conditions except for the TiC$_x$N$_y$ and Al$_2$O$_3$ depositing times being 4 h and 10 h, respectively.
E) Cemented carbide cutting inserts of the same type as in B) differing only in TiC$_x$N$_y$- and α-Al$_2$O$_3$-layer thickness, being 6 μm and 10 μm thick respectively, were manufactured using the same processing conditions except for the TiC$_x$N$_y$ and Al$_2$O$_3$ depositing times being 4 h and 10 h, respectively.

F) Cemented carbide cutting inserts of the same type as in C) differing only in TiC$_x$N$_y$- and α-Al$_2$O$_3$-layer thickness, being 6 μm and 10 μm thick respectively, were manufactured using the same processing conditions except for the TiC$_x$N$_y$ and Al$_2$O$_3$ depositing times being 4 h and 10 h, respectively.

XRD-analysis of the deposited Al$_2$O$_3$-layer of the inserts according to A)-F) showed that it consisted only of the α-phase with a texture coefficient TC(012)=1.6 defined as below:

$$TC(012) = \frac{I(012)}{I_0(012)} \left\{ \frac{1}{n} \sum \frac{I(hkl)}{I_o(hkl)} \right\}^{-1}$$

where:

I(hkl)=measured intensity of the (hkl) reflection

I$_o$(hkl)=standard intensity of Powder Diffraction File JCPDS No 43-1484.

n=number of reflections used in the calculation (hkl) reflections used are: (012), (104), (110), (113), (024), (116).

The coated inserts according to A)-F) were post treated by the earlier mentioned blasting method, blasting the rake face of the inserts, using a blasting pressure of 2.4 bar and an exposure time of 20 seconds.

The smoothness of the coating surface expressed as a well known roughness value Ra was measured by AFM on an equipment from Surface Imaging System AG (SIS). The roughness was measured on ten randomly selected plane surface areas (10 μm×10 μm) in the chip contact zone on rake face. The resulting mean value from these ten Ra values, MRa, was 0.11 μm.

X-ray Diffraction Analysis using a Bragg-Brentano diffractometer, Siemens D5000, was used to determine the I(012)/I(024)-ratio using Cu Kα-radiation.

The obtained I(012)/I(024)-ratio on the clearance side was about 1.4. A corresponding measurement on the rake face showed that the obtained I(012)/I(024)-ratio was about 2.2.

The residual stress was determined using ψ-geometry on an X-ray diffractometer Bruker D8 Discover-GADDS equipped with laser-video positioning, Euler ¼-cradle, rotating anode as X-ray source (CuK$_α$-radiation) and an area detector (Hi-star). A collimator of size 0.5 mm was used to focus the beam. The analysis was performed on the TiC$_x$N$_y$ (422) reflection using the goniometer settings 2θ=126°, ω=63° and φ=0°, 90°, 180°, 270°. Eight ψ tilts between 0° and 70° were performed for each φ-angle. The sin$^2$ψ method was used to evaluate the residual stress using the software DIFFRAC$^{Plus}$ Stress32 v. 1.04 from Bruker AXS with the constants Young's modulus, E=480 GPa and Poisson's ratio, ν=0.20 and locating the reflection using the Pseudo-Voigt-Fit function. A biaxial stress state was confirmed and the average value was used as the residual stress value. Measurements were carried out both on the rake face and the clearance side. The obtained tensile stress on the clearance side was about 630 MPa for the inserts according to A)-F). A corresponding measurement on the rake face showed that a tensile stress of about 370 MPa was obtained for the inserts according to A)-C) a tensile stress of about 390 MPa was obtained for the inserts according to D) and F).

EXAMPLE 2

Inserts A) from Example 1 were tested and compared with commercially available, nonblasted inserts (high performance inserts in the P15 area) with respect to toughness in a longitudinal turning operation with interrupted cuts.

Material: Carbon steel SS1312.
Cutting data:
Cutting speed=120 m/min
Depth of cut=1.5 mm
Feed=Starting with 0.15 mm and gradually increased by 0.08 mm/min until breakage of the edge
10 edges of each variant were tested
Inserts style: CNMG120408-PM
Results (Average feed at breakage):

| | |
|---|---|
| Commercially available inserts | 0.244 mm/rev |
| Inserts A) from Example 1 | 0.275 mm/rev |

EXAMPLE 3

Inserts D) from Example 1 were tested and compared with the same commercially available inserts as in Example 2 with respect to toughness in a longitudinal turning operation with interrupted cuts.

Material: Carbon steel SS1312.
Cutting data:
Cutting speed=140 m/min
Depth of cut=1.5 mm
Feed=Starting with 0.15 mm and gradually increased by 0.08 mm/min until breakage of the edge
10 edges of each variant were tested
Inserts style: CNMG120408-PM
Results (Average feed at breakage):

| | |
|---|---|
| Commercially available inserts | 0.232 mm/rev |
| Inserts D) from Example 1 | 0.315 mm/rev |

EXAMPLE 4

Inserts A) from Example 1 were tested and compared with the same commercially available inserts as in Example 2 with respect to resistance to gross plastic deformation in a facing operation of SS2541.

Cutting data:
Cutting speed=220 m/min
Feed=0.35 mm/rev.
Depth of cut=2 mm
Tool life criteria: flank wear>=0.5 mm
Results (Number of machining cycles needed to reach tool life):

| | |
|---|---|
| Commercially available inserts | 65 |
| Inserts A) from Example 1 | 85 |

EXAMPLE 5

Inserts A) from Example 1 were tested and compared with the same commercially available inserts as in Example 2 with respect to resistance to plastic deformation close to the edge in turning of SS2244-05.
Cutting data:
Cutting speed=200 m/min
Feed=0.35 mm/rev.
Depth of cut=2.5 mm
Tool life criteria: flank wear>=0.4 mm
Results (Number of machining cycles needed to reach tool life):

| | |
|---|---|
| Commercially available inserts | 19 |
| Inserts A) from Example 1 | 27* |

*The test for inserts A) was terminated prematurely, after 27 cycles, with the defined tool life criteria still not being reached.

Examples 3-5 show that the inserts A) and D) from Example 1 and according to the invention exhibit much better plastic deformation resistance in combination with better toughness behavior in comparison to the inserts according to prior art.

EXAMPLE 6

Inserts B), C), E) and F) from Example 1 were tested and compared with the same commercially available inserts as in Example 2 with respect to toughness in a longitudinal turning operation with interrupted cuts.
Material: Carbon steel SS1312.
Cutting data:
Cutting speed=150 m/min
Depth of cut=1.5 mm
Feed=Starting with 0.15 mm and gradually increased by 0.08 mm/min until breakage of the edge.
10 edges of each variant were tested
Inserts style: CNMG120408-PM
Results:

| | Average feed at breakage (mm/rev) |
|---|---|
| Commercially available inserts | 0.206 |
| B) | 0.270 |
| C) | 0.259 |
| E) | 0.230 |
| F) | 0.216 |

EXAMPLE 7

Inserts B) and C) from Example 1 were tested and compared with the same commercially available inserts as in Example 2 with respect to resistance to gross plastic deformation in a facing operation of SS2541.
Cutting data:
Cutting speed=200 m/min
Feed=0.35 mm/rev.
Depth of cut=2 mm
Tool life criteria: flank wear>=0.5 mm
Insert style: CNMG120408-PM Results:

| | Number of machining cycles needed to reach tool life |
|---|---|
| Commercially available inserts | 59.5 |
| B) | 61 |
| C) | 63 |

EXAMPLE 8

Inserts B), C), E) and F) from Example 1 were tested and compared with the same commercially available inserts as in Example 2 with respect to resistance to gross plastic deformation in a facing operation of SS2541. The test comprised two different insert sizes, represented by two different insert styles: CNMG160612-PR (cutting edge length=16 mm) and CNMG190612-PR (cutting edge length=19 mm).
Cutting data:
Cutting speed=220 m/min
Feed=0.35 mm/rev.
Depth of cut=3 mm
Tool life criteria: flank wear>=0.5 mm
Results:

| | Number of machining cycles needed to reach tool life | |
|---|---|---|
| | CNMG160612-PR | CNMG190612-PR |
| Commercially available inserts | 36 | 50 |
| B) | 52 | 70 |
| C) | 45 | 52 |
| E) | 51 | 77 |
| F) | 51 | 58 |

Although described in connection with preferred embodiments thereof, it will be appreciated by those skilled in the art that additions, deletions, modifications, and substitutions not specifically described may be made without department from the spirit and scope of the invention as defined in the appended claims.

What is claimed is:
1. A coated cutting tool insert of cemented carbide comprising:
a body of generally polygonal or round shape having at least one rake face and at least one clearance face; and
a coating on the body, wherein said insert is at least partly coated with the coating,
wherein said body has a composition including 4.4-6.6 wt-% Co, 4-8.5 wt-% cubic carbides, balance WC, a CW-ratio in the range 0.78-0.92 and has a surface zone of a thickness of 10 to 40 μm, depleted from the cubic carbides TiC, TaC and/or NbC,
wherein said coating is 10-25 μm thick and includes at least one layer of $TiC_xN_y$, where $x \geq 0$, $y \geq 0$ and $x+y=1$ and an $\alpha$-$Al_2O_3$-layer, the $\alpha$-$Al_2O_3$-layer being the outer layer at least on the rake face, and
wherein:
(i) on said at least one rake face:
the $TiC_xN_y$-layer has a thickness of from 3 μm to 15 μm and a tensile stress level of 50-500 MPa, and the α-Al$_2$O$_3$-layer has a thickness of from 3 μm to 12 μm, is the outermost layer with an XRD-diffraction intensity ratio I(012)/I(024)≧1.3, and has a mean Ra value MRa<0.12 μm at least in the chip contact zone on the rake face, and on said at least one clearance face:

the TiC$_x$N$_y$-layer has a tensile stress in the range 500-700 MPa, and the α-Al$_2$O$_3$-layer has an XRD-diffraction intensity ratio I(012)/I(024)<1.5, or (ii) on said at least one rake face and said at least one clearance face:

the TiC$_x$N$_y$-layer has a thickness of from 3 μm to 15 μm and a tensile stress level of 50-500 MPa, the α-Al$_2$O$_3$-layer has a thickness of from 3 μm to 12 μm, has an XRD-diffraction intensity ratio I(012)/I(024)≧1.3, and is the outermost layer on the rake face with a mean Ra value MRa<0.12 μm at least in the chip contact zone on the rake face, and the outermost layer on said clearance face consists of a colored heat resistant paint or a colored PVD-layer.

2. The coated cutting tool insert according to claim 1, comprising a 0.2-2 μm TiC$_x$N$_y$O$_z$ bonding layer between the TiC$_x$N$_y$-layer and the Al$_2$O$_3$-layer, wherein x≧0, z>0 and y≧0 for the TiC$_x$N$_y$O$_z$ bonding layer.

3. The coated cutting tool insert according to claim 1, wherein the α-Al$_2$O$_3$-layer has a texture in the 012-direction with a texture coefficient TC(012)>1.3.

4. The coated cutting tool insert according to claim 3, wherein the α-Al$_2$O$_3$-layer has a texture in the 012-direction with a texture coefficient TC(012)>1.5.

5. The coated cutting tool insert according to claim 1, wherein the α-Al$_2$O$_3$-layer has a texture in the 110-direction with a texture coefficient TC(110)>1.5.

6. The coated cutting tool insert according to claim 1, wherein the coating includes additional layers composed of metal nitrides and/or carbides and/or oxides with the metal elements selected from Ti, Nb, Hf, V, Ta, Mo, Zr, Cr, W and Al to a total layer thickness of <5 μm.

7. The coated cutting tool insert according to claim 1, wherein said surface zone depleted from cubic carbides has a thickness of from 15 μm to 35 μm.

8. The coated cutting tool insert according to claim 7, wherein said surface zone depleted from cubic carbides has a thickness of from 20 μm.

9. The coated cutting tool insert according to claim 7, wherein said surface zone depleted from cubic carbides has a thickness to 30 μm.

10. The coated cutting tool insert according to claim 9, wherein said surface zone depleted from cubic carbides has a thickness to 25 μm.

11. The coated cutting tool insert according to claim 1, wherein the composition of said body includes 5.0-6.0 wt-% Co.

12. The coated cutting tool insert according to claim 11, wherein the composition of said body includes 5.0-5.8 wt-% Co.

13. The coated cutting tool insert according to claim 1, wherein the at least one layer of TiC$_x$N$_y$ is TiC$_x$N$_y$ deposited by MTCVD.

14. The coated cutting tool insert according to claim 1, wherein the TiC$_x$N$_y$-layer has a thickness from 4 μm.

15. The coated cutting tool insert according to claim 14, wherein the TiC$_x$N$_y$-layer has a thickness from 5 μm.

16. The coated cutting tool insert according to claim 15, wherein the TiC$_x$N$_y$-layer has a thickness from 6 μm.

17. The coated cutting tool insert according to claim 1, wherein the TiC$_x$N$_y$-layer has a thickness to 13 μm.

18. The coated cutting tool insert according to claim 17, wherein the TiC$_x$N$_y$-layer has a thickness to 10 μm.

19. The coated cutting tool insert according to claim 1, wherein the TiC$_x$N$_y$-layer on said at least one rake face has a tensile stress level of 50-450 MPa.

20. The coated cutting tool insert according to claim 1, wherein the α-Al$_2$O$_3$-layer has a thickness from 3.5 μm.

21. The coated cutting tool insert according to claim 20, wherein the α-Al$_2$O$_3$-layer has a thickness from 4 μm.

22. The coated cutting tool insert according to claim 1, wherein the α-Al$_2$O$_3$-layer has a thickness to 11 μm.

23. The coated cutting tool insert according to claim 22, wherein the α-Al$_2$O$_3$-layer has a thickness to 10 μm.

24. The coated cutting tool according to claim 1, wherein the α-Al$_2$O$_3$-layer on said at least one rake face has an XRD-diffraction intensity ratio I(012)/I(024)≧1.5.

25. The coated cutting tool insert according to claim 1, wherein the α-Al$_2$O$_3$-layer has a mean Ra value MRa≦0.10 μm.

26. The coated cutting tool insert according to claim 1, wherein the α-Al$_2$O$_3$-layer on said at least one clearance face is covered with a TiN, TiC$_x$N$_y$, ZrC$_x$N$_y$ or TiC layer giving the insert a different color on that face.

27. The coated cutting tool insert according to claim 26, wherein the TiN, TiC$_x$N$_y$, ZrC$_x$N$_y$ or TiC layer has a thickness of 0.1-2 μm.

* * * * *